(12) United States Patent
Ikeda et al.

(10) Patent No.: US 7,837,828 B2
(45) Date of Patent: Nov. 23, 2010

(54) SUBSTRATE SUPPORTING STRUCTURE FOR SEMICONDUCTOR PROCESSING, AND PLASMA PROCESSING DEVICE

(75) Inventors: Taro Ikeda, Nirasaki (JP); Sumi Tanaka, Nirasaki (JP); Kaoru Yamamoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 297 days.

(21) Appl. No.: 11/221,704

(22) Filed: Sep. 9, 2005

(65) Prior Publication Data

US 2006/0005930 A1  Jan. 12, 2006

Related U.S. Application Data

(63) Continuation-in-part of application No. PCT/JP03/16960, filed on Dec. 26, 2003.

(30) Foreign Application Priority Data

Mar. 12, 2003  (JP) .............................. 2003-066165
May 19, 2003  (JP) .............................. 2003-140389

(51) Int. Cl.
*H01L 21/00* (2006.01)
*C23C 14/00* (2006.01)
*C23C 16/00* (2006.01)

(52) U.S. Cl. ........................... 156/345.53; 156/345.51; 118/728; 118/724; 361/234; 279/128

(58) Field of Classification Search ................ 118/724, 118/725; 156/345.53; 361/234; 279/128
See application file for complete search history.

(56) References Cited

U.S. PATENT DOCUMENTS

| 4,116,222 A * | 9/1978 | Seifried ........................ 126/589 |
| 4,399,016 A * | 8/1983 | Tsukada et al. ........... 156/345.45 |
| 4,565,601 A * | 1/1986 | Kakehi et al. .................. 216/59 |
| 5,234,527 A * | 8/1993 | Nozawa et al. .......... 156/345.27 |
| 5,673,750 A * | 10/1997 | Tsubone et al. .............. 165/275 |
| 5,743,111 A * | 4/1998 | Sasaki et al. ................... 62/511 |
| 6,402,848 B1 * | 6/2002 | Horiguchi et al. ............ 118/715 |
| 2001/0018951 A1 * | 9/2001 | Masuda et al. ............... 156/345 |
| 2001/0046112 A1 * | 11/2001 | Herchen ...................... 361/234 |
| 2002/0170677 A1 * | 11/2002 | Tucker et al. ........... 156/345.48 |

FOREIGN PATENT DOCUMENTS

| EP | 1 329 948 A1 | 7/2003 |
| JP | 5-114583 | 5/1993 |
| JP | 5-335283 | 12/1993 |
| JP | 7-335732 | 12/1995 |
| JP | 8-115901 | 5/1996 |

(Continued)

*Primary Examiner*—Ram N. Kackar
(74) *Attorney, Agent, or Firm*—Oblon, Spivak, McClelland, Maier & Neustadt, L.L.P.

(57) ABSTRACT

A substrate supporting structure (50) for semiconductor processing, comprising a mounting table (51) for placing a processed substrate (W) disposed in a processing chamber (20), wherein temperature control spaces (507) for storing the fluid used as a heat exchange medium are formed in the mounting table (51), a conductive transmission path (502) is disposed to lead a high frequency power to the mounting table (51), and flow channels (505, 506) feeding or discharging the heat exchange medium fluid to or from the temperature control spaces (507) are formed in the transmission path (502).

15 Claims, 9 Drawing Sheets

FOREIGN PATENT DOCUMENTS

| | | |
|---|---|---|
| JP | 8-339984 | 12/1996 |
| JP | 9-191003 | 7/1997 |
| JP | 9-209147 | 8/1997 |
| JP | 9-213780 | 8/1997 |
| JP | 9-275132 | 10/1997 |
| JP | 10020752 | 1/1998 |
| JP | 11-3878 | 1/1999 |
| JP | 2000-183028 | 6/2000 |
| JP | 2000-286235 A | 10/2000 |
| JP | 2000286235 A * | 10/2000 |
| JP | 2001-68538 | 3/2001 |
| JP | 2001-257247 | 9/2001 |
| JP | 2001-308077 A | 11/2001 |
| JP | 2001-332465 | 11/2001 |
| JP | 2002-208584 | 7/2002 |
| JP | 2003-45952 | 2/2003 |
| WO | WO 02/23609 A1 | 3/2002 |
| WO | WO 02-56357 A | 7/2002 |

* cited by examiner

| | FREQUENCY (MHz) | | POWER (W) | POTENTIAL (V) |
|---|---|---|---|---|
| | RANGE | PREFERABLE RANGE | RANGE | RANGE |
| PLASMA EXCITATION | 0.45~60 | 0.45~13.65 | 800~1500 | - |
| BIAS | 13.56~60 | 50~300 | 50~300 | -150~-25 |

…

SUBSTRATE SUPPORTING STRUCTURE FOR SEMICONDUCTOR PROCESSING, AND PLASMA PROCESSING DEVICE

This application is a Continuation-In-Part Application of PCT International Application No. PCT/JP03/016960 filed on Dec. 26, 2003, which designated the United States.

FIELD OF THE INVENTION

The present invention relates to a substrate supporting structure and a plasma processing device. The term "semiconductor processing" used herein implies various processes to manufacture a semiconductor device and/or a structure including wiring, electrodes, and the like connected to the semiconductor device on a substrate to be processed, by forming a semiconductor layer, an insulating layer, a conductor layer, and the like, after a predetermined pattern, on the substrate to be processed, e.g., a semiconductor wafer, an LCD (Liquid Crystal Display) or an FPD (Flat Panel Display).

BACKGROUND OF THE INVENTION

With the recent trend of highly integrated and high-performance semiconductor device, improvement in productivity of manufacturing the semiconductor is very essential to realize cost reduction. As for a method for improving the productivity, increasing a diameter of a semiconductor substrate may be enumerated. Conventionally, a 200 mm substrate has been used as a semiconductor substrate (wafer), but, now, a 300 mm substrate is mainly used. If a semiconductor device is fabricated by using a 300 mm substrate of a large diameter, the number of semiconductor devices, which can be produced by using one sheet of substrate, is increased, thereby improving the productivity.

In case of using a 300 mm substrate, the conventional semiconductor device for processing a 200 mm substrate should be replaced with a device capable of processing a 300 mm substrate. In this case, a substrate supporting structure for supporting the substrate becomes scaled up, so that the semiconductor processing device such as plasma processing device or the like has to be also large-scaled. Thus, the footprint of the semiconductor processing device is increased, and the number of devices, which can be disposed in a semiconductor production factory, is accordingly decreased to thereby lower the productivity of the semiconductor device. Further, if components for a 200 mm substrate are scaled up to be used for a 300 mm substrate while employing the conventional substrate supporting structure as it is, a substantial cost increase is incurred.

SUMMARY OF THE INVENTION

It is, therefore, an object of the present invention to provide a substrate supporting structure and a plasma processing device for semiconductor processing capable of realizing a scaling-down for miniaturization and reducing cost.

It is another object of the present invention to provide a plasma processing device capable of increasing at least inter-surface uniformity of a film formed on a substrate to be processed.

In accordance with the one aspect of the present invention, there is provided a substrate supporting structure for semiconductor processing including: a mounting table for mounting thereon a substrate to be processed; and a support part, disposed to be downwardly extended below the mounting table, for supporting the mounting table, wherein the mounting table contains an electrode part; a first insulating layer for covering a periphery of the electrode part; a second insulating layer for covering a bottom surface of the electrode part; and a first conducting layer covering the first and second insulating layers, wherein the support part contains a conductive transmission path for supplying a power to the electrode part; a third insulating layer for covering a periphery of the transmission path; and a second conducting layer for covering a periphery of the third insulating layer, and wherein the electrode part of the mounting table, the first and the second insulating layers and the first conducting layer are coaxially configured; the conductive transmission path of the support part, the third insulating layer and the second conducting layer are coaxially configured; the electrode part and the conductive transmission path are integrally formed; and the first and the second conducting layers are electrically connected to each other, and wherein a first channel for supplying a heat exchange medium into the electrode part is formed; and a second channel communicated with the first channel is formed in the conductive transmission path.

In accordance with another aspect of the present invention, there is provided a plasma processing device, including: an airtight processing chamber for accommodating therein a substrate to be processed; a gas supply unit for supplying a processing gas into the processing chamber; a gas pumping unit for exhausting the processing chamber; a mounting table, disposed in the processing chamber, for mounting thereon the substrate; and a support part, disposed to be downwardly extended below the mounting table, for supporting the mounting table, wherein the mounting table contains an electrode part; a first insulating layer for covering a periphery of the electrode part; a second insulating layer for covering a bottom surface of the electrode part; and a first conducting layer covering the first and second insulating layers, wherein the support part contains a conductive transmission path for supplying a power to the electrode part; a third insulating layer for covering a periphery of the transmission path; and a second conducting layer for covering a periphery of the third insulating layer, and wherein the electrode part of the mounting table, the first and the second insulating layers and the first conducting layer are coaxially configured; the conductive transmission path of the support part, the third insulating layer and the second conducting layer are coaxially configured; the electrode part and the conductive transmission path are integrally formed; and the first and the second conducting layers are electrically connected to each other, and wherein a first channel for supplying a heat exchange medium into the electrode part is formed, and a second channel communicated with the first channel is formed in the conductive transmission path.

In accordance with still another aspect of the present invention, there is provided a plasma processing device, including: an airtight processing chamber for accommodating therein a substrate to be processed; a gas supply unit for supplying a processing gas into the processing chamber; a gas pumping unit for exhausting the processing chamber; a mounting table, disposed in the processing chamber, for mounting thereon the substrate; and a conductive extension member for surrounding the substrate mounted on the mounting table, the extension member having a surface in parallel with that of the substrate, wherein the mounting table contains an electrode part to which a power is applied; a pedestal insulation layer for covering a bottom surface and a side of the electrode part; and a pedestal conduction layer, electrically connected to the support conduction layer, for covering at least a part of the bottom surface and the side of the pedestal insulation layer;

and the electrode part, the pedestal insulation layer and the pedestal conduction layer are coaxially configured, and wherein the extension member is disposed on the pedestal insulation layer while being electrically insulated from the electrode part and the pedestal conduction layer; in the side of the pedestal insulation layer, a top end of the pedestal conduction layer is disposed to be placed below a bottom portion of the electrode part; and impedance between the extension member and the pedestal conduction layer is set to be greater than impedance between the electrode part and the pedestal conduction layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Figure 1:
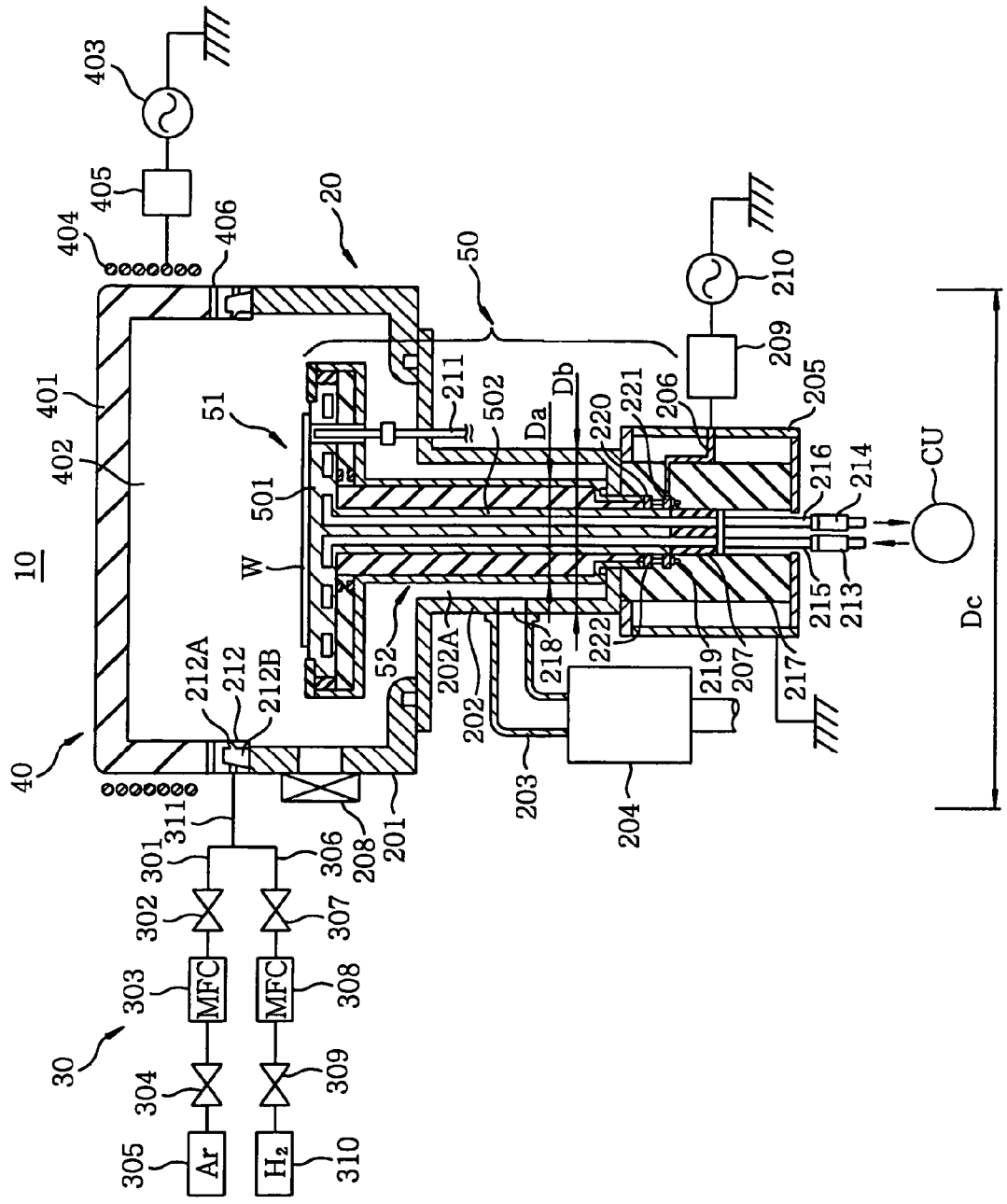
FIG. 1 offers a configuration view showing a plasma processing device containing a substrate supporting structure for semiconductor processing in accordance with a first embodiment of the present invention.

Preferred embodiments of the present invention will be described in detail with reference to the accompanying drawings. In the following discussion, identical reference numerals will be assigned for corresponding parts having substantially same functions and configurations, and redundant explanations will be omitted unless necessary.

First Embodiment

FIG. 1 is a configuration view showing a plasma processing device including a substrate supporting structure for semiconductor processing in accordance with a first embodiment of the present invention. A plasma processing device 10 is configured to perform a sputter etching or a reactive etching on a silicon oxide film, a metal oxide film or the like, which is formed on a semiconductor wafer as a substrate to be processed.

As shown in FIG. 1, the plasma processing device 10 includes a processing chamber 20 for receiving thereinto a substrate W to be processed. To the processing chamber 20, a gas supply unit 30 for supplying a processing gas thereinto is coupled. An excitation mechanism 40 for converting the processing gas into a plasma is disposed at an outer upper side of the processing chamber 20. A mounting table 51 of a substrate supporting structure 50 for supporting the substrate W to be processed is disposed at an inner lower side of the processing chamber 20.

The processing chamber 20 is formed by combining a conductive cylindrical lower side vessel 201 with an insulating cylindrical upper vessel or bell jar 401. In a center of a bottom portion of the lower side vessel 201, there is formed an opening, to which a downwardly protruded cylindrical exhaust chamber 202 is airtightly coupled. The exhaust chamber 202 has a planar outline, which is sufficiently small, compared to the processing chamber 20; and it is concentrically placed with the processing chamber 20.

At a bottom portion of the exhaust chamber 202, a support part 52 of the substrate supporting structure 50 is attached. The support part 52 of the substrate supporting structure 50 is fixed to the bottom portion of the exhaust chamber 202 by using an attachment ring 221, screw reception rings 220 and 222, clamping screws 219 and the like. Detailed descriptions thereof will be explained later with reference to FIG. 2. The support part 52 is vertically elevated at a center of the exhaust chamber 202, to thereby be coupled to the mounting table 51 through the opening of the bottom portion of the lower side vessel 201.

An opening 218 is formed in a sidewall of the exhaust chamber 202, and a gas pumping unit 204, e.g., a turbo molecular pump or the like, is connected thereto through a gas exhaust line 203. In case when performing an etching, particularly, a sputter etching, a space needs to be kept under a low pressure. For example, the processing space needs to be maintained at a low pressure in the range of 0.0133~1.33 Pa, and preferably, 0.0133~0.133 Pa, by using the gas pumping unit 204 such as a turbo molecular pump or the like.

An airtight processing space 402 in the processing chamber 20 is vacuum-exhausted by the gas pumping unit 204 through an exhaust space 202A of the exhaust chamber 202, which surrounds the support part 52. Since the processing space 402 is exhausted through the exhaust space 202A concentrically disposed therebelow, the processing space 402 can be uniformly exhausted compared to the case where the processing space 402 is exhausted through the side of the processing chamber 20. Namely, the processing gas can be uniformly exhausted with respect to the substrate W as a center. Thus, the pressure in the processing space 402 becomes uniform, thereby producing the plasma uniformly. Hence, uniformity in etching rate while performing an etching on the substrate to be processed is enhanced.

At the bottom portion of the exhaust chamber 202, there is disposed a shielding member or a shield cover 205 made of metal, e.g., aluminum, alloy thereof, that is grounded. An RF introducing component 206 for introducing an RF power into the mounting table 51 of the substrate supporting structure 50 is disposed in the shield cover 205. The RF introducing component 206 is connected to a high frequency (RF) power supply 210 for a bias-applied through a matching unit 209.

The mounting table 51 of the substrate supporting structure 50 has an electrode part 501 of a circular plate shape; and at the same time, the support part 52 of a columnar shape has a conductive RF transmission path 502. The electrode part 501 and the transmission path 502 are formed as a unit by using a conductive material such as Al, alloy of Al, or the like, which are electrically connected to each other. A lower portion of the transmission path 502 is electrically connected to the RF introducing component 206. Thus, the RF power is supplied to the electrode part 501 of the mounting table 51 from the RF power supply 210 though the transmission path 502, and therefore, a bias voltage is applied to the substrate W to be processed. The shield cover 205 shields the RF to prevent any leakage thereof to the outside.

In the electrode part 501 of the mounting table 51, there is formed a heat exchange medium chamber 507 (herein, a temperature control space, formed as a flow path) for accommodating therein a heat exchange medium, e.g., an insulating coolant fluid, for controlling temperature of the mounting table 51. Meanwhile, in the transmission path 502 of the support part 52, an introduction channel 215 and a discharge channel 216 are formed to supply the heat exchange medium into the temperature control space 507 and discharge it therefrom.

At a lower portion of the support part 52, an insulation component 207 made of an insulating material such as ceramic, e.g., $Al_2O_3$, resin or the like, is disposed. The introduction channel 215 and the discharge channel 216 pass through the insulation component 207 to be coupled to metallic connection tubes 213 and 214, respectively, that are attached to the insulation component 207. Thus, the connection tubes 213 and 214 are electrically insulated from the RF transmission path 502 by the insulate component 207. Peripheries of the insulation component 207 and the lower portion of the transmission path 502 are covered by a thermal insulator 217.

The connection tubes 213 and 214 are coupled to a circulation unit (CU), e.g., a chiller, which functions to control the temperature. The heat exchange medium is circulated from the circulation unit (CU) to the temperature control space 507 through the introduction channel 215 and the discharge channel 216, so that the temperature of the mounting table 51 is maintained at a predetermined temperature.

In a side of the lower side vessel 201, there is formed a transfer port for substrate W, in which a gate valve 208 is disposed. While the gate valve 208 is opened, the substrate W to be processed can be loaded into the processing chamber 20 and unloaded therefrom. At that time, lift pins (e.g., three) of an elevation mechanism 211 are operated to assist transportation of the substrate W from the mounting table 51.

A gas supply unit 30 includes an Ar gas supply source 305 connected to the gas supply line 311 through an Ar gas line 301, and an $H_2$ gas supply source 310 connected thereto through an $H_2$ gas line 306. Valves 302 and 304 and a mass flow controller 303 are disposed in the Ar gas line 301. If the valves 302 and 304 are opened, Ar gas is supplied to the gas supply line 311, wherein the flow rate of the gas to be supplied is controlled by the mass flow controller 303. In the same manner, valves 307 and 309 and a mass flow controller 308 are disposed in the $H_2$ gas line 306. If the valves 307 and 309 are opened, $H_2$ gas is supplied to the gas supply line 311, wherein the flow rate of the gas to be supplied is controlled by the mass flow controller 308.

The gas supply line 311, through which Ar gas and $H_2$ gas are supplied, is connected to a gas supply ring 212, which is annularly disposed on the lower side vessel 201 along the edge thereof. A gas supply groove 212B is annularly formed in the gas supply ring 212 to discharge Ar gas or $H_2$ gas over the entire periphery of the gas supply ring 212. Ar gas or $H_2$ gas is supplied towards the center of the processing space 402 through gas holes 212A communicating with the gas supply groove 212B. Ar gas or $H_2$ gas supplied to the processing space 402 turns into a plasma by an excitation mechanism 40 explained hereinafter.

An upper vessel, i.e., a bell jar 401, is made of a dome shaped insulating material, e.g., quartz, ceramic ($Al_2O_3$, AlN) or the like. An antenna coil 404 of the excitation mechanism 40 is wound around the periphery of the bell jar 401. The coil 404 is coupled to an RF power supply 403 through a matching unit 405. The RF power supply 403 generates an RF power having a frequency in the range of, e.g., 450 kHz~60 MHz (preferably, 450 kHz~13.56 MHz).

If the RF power is supplied to the coil 404 from the RF power supply 403, an induced magnetic field is formed in the processing space 402. By the induced magnetic field, gas such as Ar, $H_2$ or the like, supplied into the processing space 402, turns into a plasma. Such plasma is referred to as an inductively coupled plasma (ICP). With the plasma excited as above, a plasma processing, e.g., an etching, is performed on the substrate disposed on the mounting table 51.

In the plasma processing device 10, a diameter Da of the columnar support part 52 of the substrate supporting structure 50 can be made small. Thus, a diameter Db of the exhaust chamber 202 can be made small and the total plasma processing device 10 becomes small, to thereby reduce foot print (occupation area). Further, members such as the gas pumping unit 204, e.g., turbo molecular pump, a pressure control valve (not shown) and the like are coupled through the gas exhaust line 203 to a gas exhaust port 218 formed on the sidewall of the exhaust chamber 202 (by using the space efficiently). Therefore, the gas exhaust line 203 or the gas pumping unit 204 can be disposed within the outline of the lower side vessel 201 or the excitation mechanism 40 (inside the range shown as the diameter Dc in FIG. 1).

Figure 2:
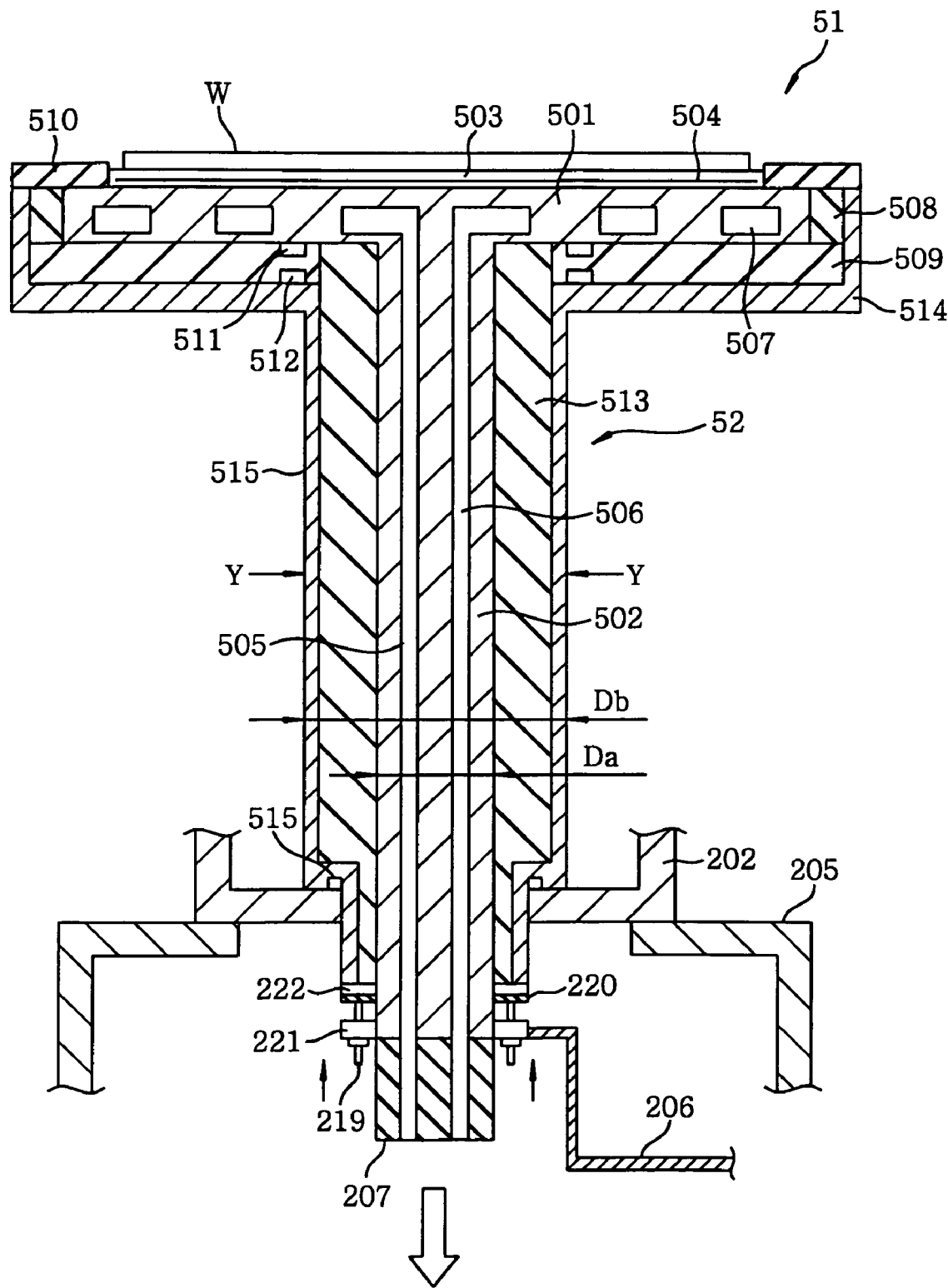
FIG. 2 describes a cross sectional view showing a magnified substrate supporting structure shown in FIG. 1.

FIG. 2 is a cross sectional view showing a magnified substrate supporting structure 50 shown in FIG. 1. Hereinafter, the substrate supporting structure 50 will be discussed with reference to FIG. 2. As described above, the substrate supporting structure 50 includes the circular plate shaped mounting table 51 and the columnar support part 52 concentrically disposed therebelow.

The mounting table 51 contains the aforementioned electrode part 501 to which the RF power is applied. The side of the electrode part 501 is covered with a ring block 508 made of a dielectric material such as quartz or the like. A bottom surface of the electrode part 501 is covered with a plate block 509 made of a dielectric material, e.g., quartz, and having in the center thereof holes, through which the transmission path 502 passes. A pedestal insulation layer is formed of the ring block 508 and the plate block 509. The bottom surfaces and sides of the insulation layers 508 and 509 are also coated with a pedestal cover (pedestal conduction layer) 514 made of a conductive material such as Al, Ti or the like. The electrode part 501, the insulation layers 508 and 509 and the conduction layer 514 are coaxially configured.

Meanwhile, the support part 52 includes the aforementioned conductive transmission path 502 for introducing the RF power. The transmission path 502 is coated with an insulator (support insulation layer) 513 made of a dielectric material such as PTFE (polytetrafluoroethylene) or the like. The insulator 513 is also coated with a support cover (support conduction layer) 515 made of a conductive material such as Al, Ti or the like, which is grounded. The transmission path 502, the support insulation layer 513 and the support conduction layer 514 are coaxially configured.

The electrode part 501 and the transmission path 502 are molded as a unit by using a conductive material such as Al, alloy thereof or the like, so that these are electrically connected to each other. The ring block and the plate block (pedestal insulation layers) 508 and 509 and the insulator (support insulation layer) 513 are formed individually. The pedestal cover (pedestal conduction layer) 514 and the support cover (support conduction layer) 515 are molded individually. However, they are unified by welding, and at the same time, electrically connected to each other.

As described above, the temperature control space 507 accommodating therein the heat exchange medium (fluid) for uniformly maintaining the substrate to be processed at a predetermined temperature is formed in the electrode part 501. In the temperature control space 507, the introduction channel 505 and the discharge channel 506, which are formed in the transmission path 502, are connected to each other; and a flow path, through which the heat exchange medium flows between the introduction channel 505 and the discharge channel 506, is formed.

Figure 3:
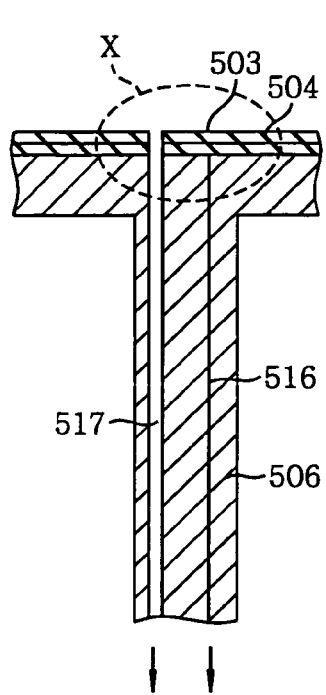
FIG. 3 sets forth a cross sectional view showing a part of the substrate supporting structure shown in FIG. 1.

FIG. 3 is a cross sectional view showing a part of the substrate supporting structure shown in FIG. 1, which describes a cross section substantially normal to the cross section shown in FIG. 2. A dielectric layer 503 made of a dielectric material, e.g., alumina ($Al_2O_3$) or the like, is disposed on a top surface (and a side) of the electrode part 501, with which the substrate W makes a contact. An electrode 504 is inserted into the dielectric layer 503, disposed on the top surface, to form an electrostatic chuck together with the dielectric layer 503. The electrode 504 is connected to a DC power supply (not shown) disposed at the outside of the processing chamber 20 through a wiring 516, which extends through the transmission path 502 while being insulated. If a voltage is applied to the electrode 504, an electrostatic polarization is generated at the dielectric layer 502 below the substrate W such that the substrate W is electrostatically adsorbed.

The dielectric layer 503 is formed by, e.g., ceramic spraying or the like. Alternatively, the dielectric layer 503 may be formed by using a method wherein a ceramic of sintered body is formed in a thin film to be jointed. Further, the dielectric layer 503 may be formed as a dielectric film such as aluminum nitride (AlN), SiC, BN or the like, without using alumina.

As described above, the substrate supporting structure 50 is coaxially configured so that mushroom shaped (T-shaped) conductive cores 501 and 502 connected to the RF power supply 210 for a bias are coated with the insulation layers (dielectric layers) 508, 509 and 513, and also, coated with conduction layers 514 and 515 that are grounded. By such a configuration, loss of the RF power is reduced; efficiency is improved; and the bias can be stably applied to the substrate to be processed.

In the first embodiment, PTFE is used as the support insulation layer (insulator) 513. The reason is that PTFE has a low permittivity of about 2 and the loss of the RF power is reduced. That is, it is preferable that a low dielectric constant material is used for the support insulation layer 513, taking the efficiency of RF power into consideration. In the same manner, it is preferable that pedestal insulation layers (ring block and plate block) 508 and 509 are formed by using a low dielectric constant material to reduce the loss in the RF power. However, followings should be noted.

In a region where the insulation layers (dielectric layers) 508, 509 and 513 of the substrate supporting structure 50 are disposed, sealing members 511 and 512 are disposed in the plated block 509 to airtightly separate the mounting table 51 side from the support part 52 side. Namely, the pedestal insulation layers 508 and 509 are placed in a space communicating with the processing space 402 where the plasma is generated in the depressurized state. For the same reason, it is not preferable to use as a material for the pedestal insulation layers 508 and 509 a medium which releases lots of gas. Further, the insulation layers 508 and 509 are greatly influenced by any temperature variation such as a rise or a fall in the temperature due to the generation of plasma.

PTFE is porous microscopically compared to a dense material such as quartz or the like, and releases lots of gas in the depressurized state. Thus, it is not preferable to use PTFE in a vacuum vessel. Further, it is problematic that PTFE deforms or has no plasma resistance, to thereby tend to be etched.

Accordingly, as for the pedestal insulation layers 508 and 509, it is preferable to employ such a material that hardly releases any gas in a depressurized vessel and is resistant to a temperature hysteresis, and more preferably, to employ a low dielectric constant material as possible. As for a material satisfying these requirements mentioned above, quartz may be enumerated, and alternatively, e.g., a resin material or the like may be used. Namely, it is preferable to use quartz for the insulation layers 508 and 509, and PTFE for the support insulation layer 513.

A focus ring 510 made of quartz or the like is disposed on the ring block 508 and the top surface (on which the substrate W is mounted) of the peripheral portion of the electrode part 501. The focus ring 510 focuses the plasma on a wafer side in the processing chamber, to thereby make the plasma uniform. Further, the focus ring 510 prevents the ring block 508 and the insulating layer 503 from being damaged due to the plasma.

As mentioned above, the introduction channel 505 and the discharge channel 506 for supplying the heat exchange medium to the electrode 501 and discharging it therefrom, respectively, are formed in the transmission path 502. Hence, as described below, the configuration of the substrate supporting structure 50 is simplified, so that the number of components is reduced, and at the same time, scale-down can be realized.

In the conventional substrate supporting structure, the RF introduction path for applying a bias to the mounting table, and the channel for introducing the heat exchange medium into the mounting table or discharging it therefrom are formed individually. Therefore, there is required a space below the mounting table, where respective components are to be disposed. Further, components of the RF introduction path and the heat exchange medium path are needed, respectively, and the number of components is large to thereby make the configuration complicated. Still further, since the size of the entire mounting table should be large, a volume to be cooled is increased, and thus, resulting in deterioration of the cooling efficiency.

In the substrate supporting structure 50 in accordance with the first embodiment, the introduction channel 505 and the discharging channel 506 are formed in the transmission path 502, so that the space for disposing the RF introduction path can be commonly shared for the heat exchange medium path. Accordingly, it is possible to reduce the number of components thereof to thereby simplify the configuration and make the space small, which in turn makes it possible to realize the scaling-down of the substrate supporting structure. For example, as shown in FIG. 2, it is possible to make the diameter Da of the support part 52 small, wherein the support part 52 contains the transmission path 502, the introduction channel 505 and the discharging channel 506. As a result, it is possible to make the diameter Db of the exhaust chamber 202 small, wherein the exhaust chamber 202 contains the support cover 515, and thus, realizing the scaling-down of the substrate supporting structure 50.

As for the heat exchange medium, an insulating fluid, e.g., fluorine based fluid (galden) or the like, may be used, since an RF current is applied to the electrode part 501. Thus, the substrate to be processed is cooled through the mounting table 51 while securing insulation, so that the temperature of the substrate W to be processed can be maintained constant.

The substrate supporting structure 50 is fixed to the exhaust chamber 202 by using an attachment ring 221, ring shaped screw reception rings 220 and 222, and clamping screws 219. The attachment ring 221 is of a substantially circular plate shape having in the center thereof a hole, through which the transmission path 502 passes. The attachment ring 221 is fixed to the transmission path 502 by a screw (not shown). The insulating screw reception ring 220 and metallic screw reception ring 222 are disposed between the attachment ring 221 and the support cover 515 such that they apply upward pressure to the support cover 515 by using the clamping screws 219, which are screwed into screw holes formed in the attachment ring 221. By clamping power of the clamping screws 219, the transmission path 502 of the substrate supporting structure 50 is extended downward, i.e., towards the shield cover 205. Therefore, the transmission path 502 and the electrode part 501, as a unit, are pressurized to be adhered closely to the plate block 509, and the plate block 509 is pressurized to be adhered closely to the cover 514. As a result, the processing space 402 can be kept airtightly by the sealing ring 511 inserted between the electrode part 501 and the plate block 509 and the sealing ring 512 inserted between the plate block 509 and the pedestal cover 514.

As mentioned above, it is possible to apply weight load needed for airtight sealing to the sealing rings 511 and 512 without using a metal screw. Hence, the processing space 402 can be assured to be airtightly kept in a state where there is no metal contamination source present in the processing space 402 where the plasma is excited.

Back to FIG. 3 again, it describes a cross section substantially normal to the cross section shown in FIG. 2. As illustrated in FIG. 3, in the transmission path 502, there is formed a gas flow passage 517 for introducing a gas, that transfers heat at a high rate between the surface of the dielectric layer 503 and the substrate W to be processed. During the plasma processing, the heat transfer gas is supplied to improve the thermal conductivity between the mounting table 51 and the substrate W to be processed, thereby efficiently cooling the substrate W to be processed. Further, as described above, the wiring 516 is disposed in the transmission path 502 to be extended therein while being insulated and is connected to a DC power supply (not shown) disposed outside the processing chamber 20. The substrate W is electrostatically adsorbed by applying a voltage to the electrode 504 of the electrostatic chuck disposed on the mounting table 51 through the wiring 516.

Figure 4:
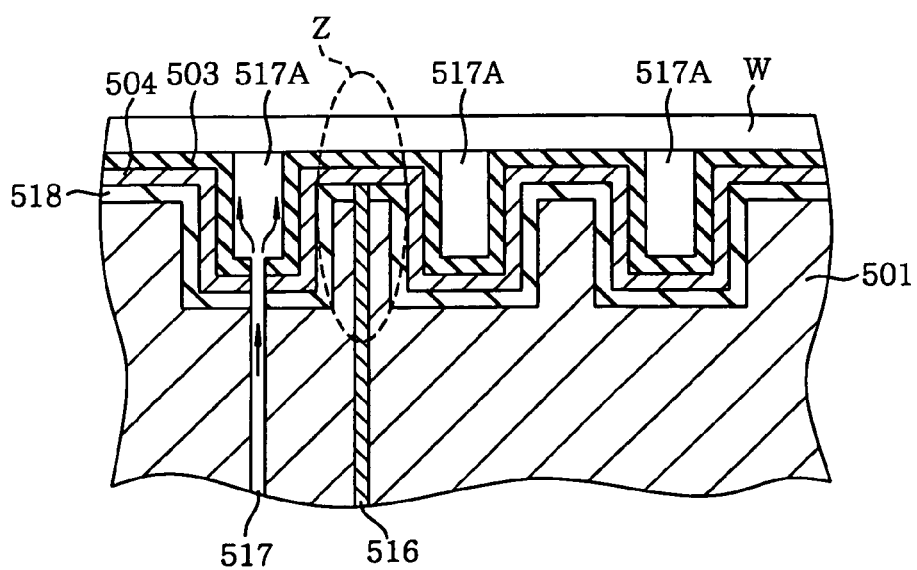
FIG. 4 presents a cross sectional view showing a magnified X part shown in FIG. 3.

FIG. 4 is a cross sectional view showing a magnified X part shown in FIG. 3. As shown in FIG. 4, the gas flow passage 517 communicates with a plurality of grooves 517A formed on the surface of the mounting table 51. The heat transfer gas, e.g., Ar, He or the like, is introduced into the grooves 517A through the gas flow passage 517. The electrode 504 of the electrostatic chuck is made of metal, e.g., W or the like. The electrode 504 is embedded between the upper and lower dielectric layers 503 and 518 made of, e.g., a thermally sprayed film of $Al_2O_3$ or the like.

Figure 5:
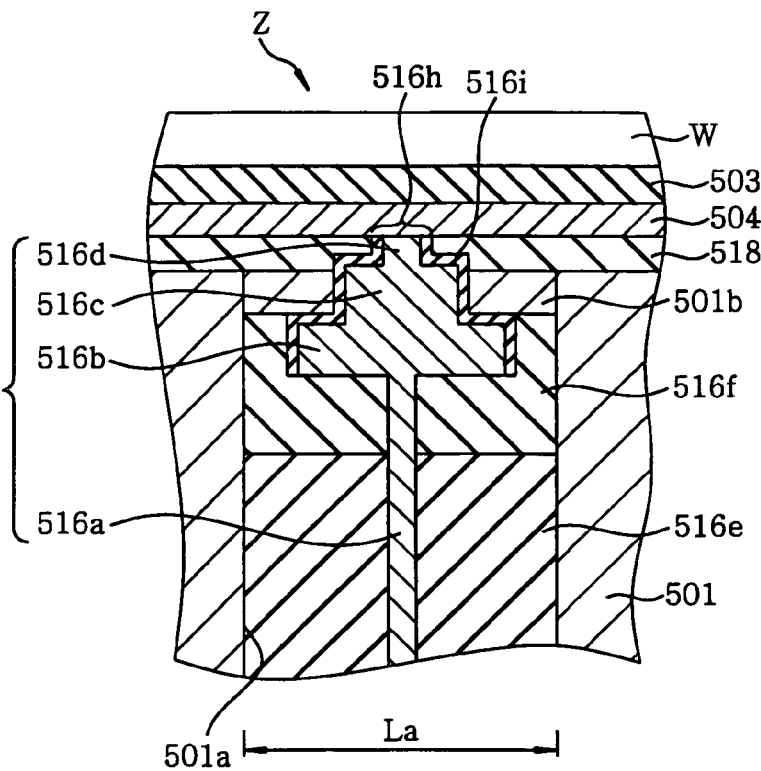
FIG. 5 provides a cross sectional view showing a magnified Z part shown in FIG. 4.

FIG. 5 is a cross sectional view showing a magnified Z part shown in FIG. 4. As illustrated in FIG. 5, the wiring 516 is made of a metal, e.g., Ti or the like. The wiring 516 is introduced into an insertion hole 501a of a diameter La which is formed on the electrode part 501. A ring 501b made of Al is disposed in the insertion hole 501a by, e.g., beam welding, and the wiring 516 is attached to a hole formed in the ring 501b.

The wiring 516 has a bar-shaped wiring portion 516a. On the bar-shaped wiring portion 516a, there is formed a block-shaped step portion 516b having a diameter larger than that of the wiring portion 516a. On the step portion 516b, there is formed a block-shaped step portion 516c having a diameter smaller than that of the step portion 516b. Further, on the step portion 516c, there is formed a block-shaped step portion 516d having a diameter smaller than that of the step portion 516c. At sidewalls of the step portions 516b, 516c and 516d, and parts of the step portions 516b and 516c which face the electrode 504, an insulating film 516i of thickness of 500 μm is formed by, e.g., $Al_2O_3$ thermal spraying. In case of applying a DC voltage to the electrode 504, the DC voltage introduced to the wiring 516 is applied through the step portion 516d that is making a contact with the electrode 504.

The space of the insertion hole 501a between the wiring 516 and the electrode part 501 is filled with insulating layers 516f and 516e made of, e.g., an insulating resin, so that the wiring 516 is isolated from the electrode part 501. The insulating layers 516f and 516e and the wiring 516 are fixed to the electrode part 501 by using, e.g., an epoxy-based adhesive.

Figure 6:
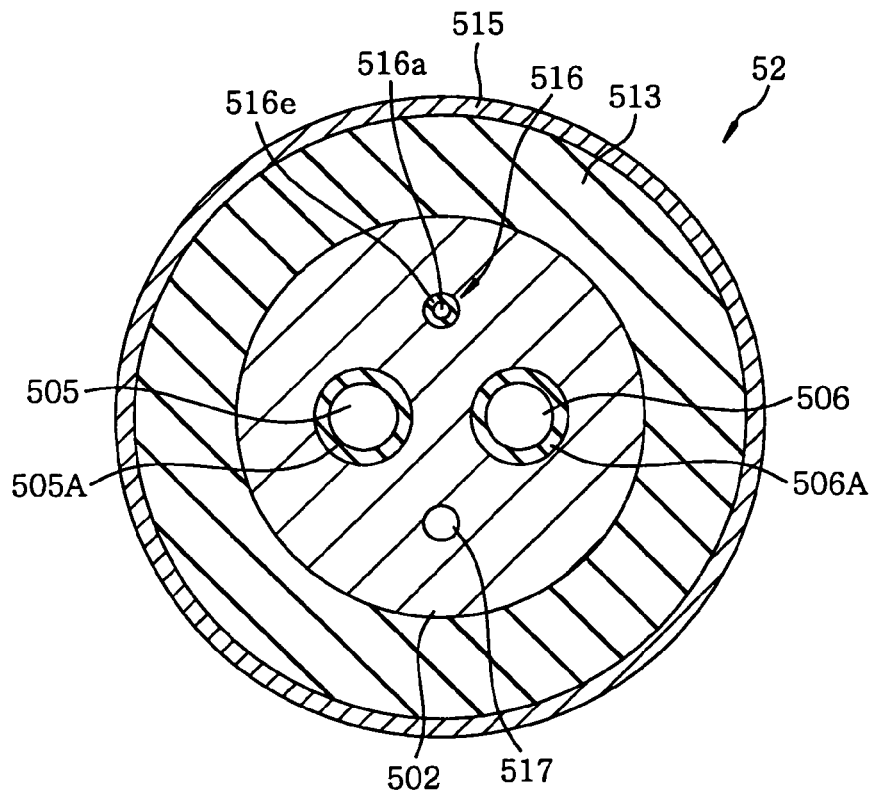
FIG. 6 describes a transversal cross sectional view taken along Y-Y line shown in FIG. 2.

FIG. 6 is a transversal cross sectional view taken along Y-Y line indicated in FIG. 2. As illustrated in FIG. 6, the introduction channel 505 and the discharging channel 506 are formed in the transmission path 502. The introduction channel 505 and the discharging channel 506 are surrounded by thermal insulators 505A and 506A, e.g., a thermally insulating tube, to increase thermal insulating effect between the heat exchange medium and the transmission path 502. Preferably, the thermal insulators 505A and 506A may be made of a material having low thermal conductivity, e.g., a fluorine based resin such as Teflon, Vespel or the like. The reason is as follows.

If the plasma processing is performed on the substrate to be processed in the processing chamber, heat is generated from the plasma. Hence, the heat exchange medium of low temperature, which is supplied into the temperature control space 507 through the introduction channel 505, is heated to a high temperature and will be discharged through the discharge channel 506. At this time, if heat is exchanged between the introduction channel 505 and the discharge channel 506 in the transmission path 502, cooling efficiency of the electrode part 501 will be deteriorated. If the introduction channel 505 and the discharge channel 506 are surrounded by the thermal insulators 505A and 506A, the heat from the discharge channel 506 is prevented from being transferred to the introduction channel 505, thereby efficiently cooling the substrate W to be processed.

As described above, the introduction channel 505, the discharge channel 506, the gas flow passage 517 and the DC voltage introduction wiring 506 are all disposed within the transmission path 502. Therefore, the substrate supporting structure becomes small and the number of components is reduced, thereby simplifying the structure and realizing the production cost reduction.

The outline of a method for processing the substrate W is as follows. First, the substrate W is supported by the substrate supporting structure 50. Subsequently, a processing gas is supplied into the processing space formed in the processing chamber 20 from the gas supply unit 30. Further, the processing gas turns into a plasma by the excitation mechanism 40 to perform a plasma processing on the substrate W.

Specifically, first, the gate valve for transfer 208, which is formed in the processing chamber 20, is opened to load the substrate W to be processed which will mounted on the electrode part 501. Thereafter, the gate valve 208 is closed and the processing space 402 is exhausted through the gas exhaust port 218 to be depressurized to be kept at a predetermined pressure.

Subsequently, the valves 304 and 302 are opened, and Ar gas is supplied form the Ar gas supply source 305 into the processing space 402 while the flow rate thereof is controlled by the mass flow controller 303. In the same manner, the valves 309 and 307 are opened, and $H_2$ gas is supplied form the $H_2$ gas supply source 310 into the processing space 402 while the flow rate thereof is controlled by the mass flow controller 308. Thereafter, an RF power from the RF power supply 403 through the matching unit 405, e.g., RF matching network, is supplied to the coil 404 to excite an inductively coupled plasma in the bell jar 401.

For example, in the manufacturing process of the semiconductor device, the plasma processing device 10 may be used in a processing for removing an impurity layer containing an oxide film formed on a metal film formed on the substrate to be processed, or an oxide film such as a native oxide film formed on a silicon. By removing such an impurity layer, adhesivity between a film to be formed thereafter and an underlayer may be improved, or sheet resistance of a film to be formed may be lowered.

Specific conditions under which the impurity layer is removed are given as follows. For example, the pressure is in the range of 0.1~13.3 Pa, and preferably, 0.1~2.7 Pa. The temperature of the wafer is 100~500° C. As for the flow rate of gas, that for Ar gas is 0.001~0.03 L/mim; and that for $H_2$ gas is 0~0.06 L/min, and preferably, 0~0.03 L/min. The frequency of the RF power supply 403 is in the range of 450 kHz~60 MHz, and preferably, 450 kHz~13.56 MHz. The power of the bias RF power supply is within the range of 0~500 W, and bias potential is in the range of −20~−200 V. By performing the plasma processing for about 30 seconds under such conditions, e.g., a silicon oxide film ($SiO_2$) is removed by about 10 nm.

Further, in case of removing a metal oxide film, e.g., $Cu_2O$, specific conditions therefore are as follows. The pressure is within the range of $3.99 \times 10^{-2}$~$1.33 \times 10^{-1}$ Pa. The temperature of the wafer is in the range of 0~200° C. As for the flow rate of gas, that for Ar gas is in the range of 0.001~0.02 L/min, and preferably, 0.001~0.03 L/min; and that for $H_2$ gas is in the range of 0~0.03 L/min, and preferably, 0~0.02 L/min. The frequency of the RF power supply 403 is in the range of 450 kHz~60 MHz, and preferably, 45 kHz~13.56 MHz. The power of the bias RF power supply is in the range of 50~300 W, and the bias potential is in the range of −150~−25 V. By performing the plasma processing for about 30 seconds under such conditions, e.g., a $Cu_2O$ film is removed by about 20~60 nm.

Figures 9, 11:
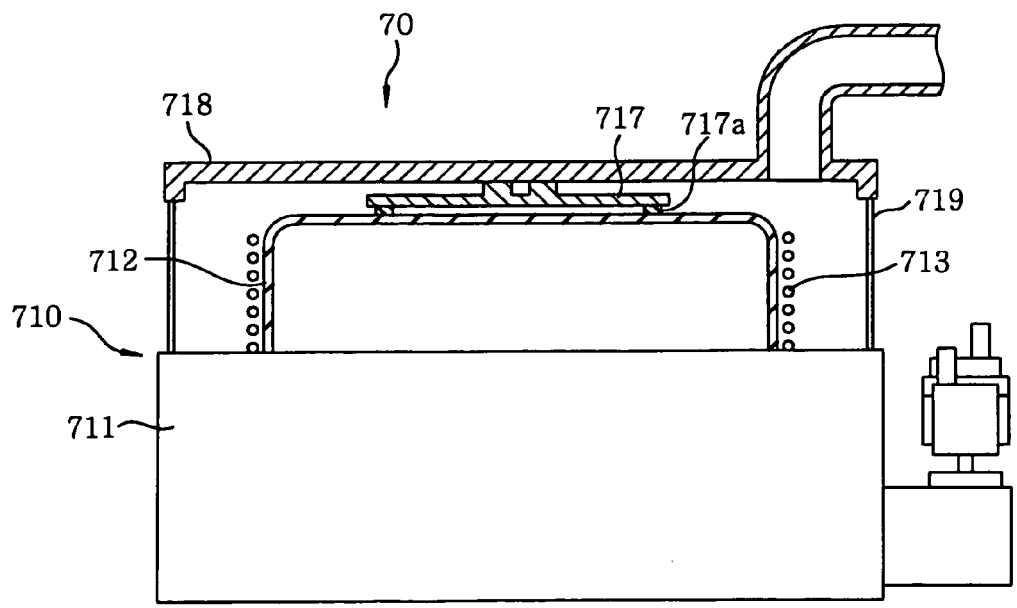
FIG. 9 presents a table showing process conditions.
FIG. 11 offers a schematic configuration view showing a configuration of a main part of the plasma processing device shown in FIG. 10.

Still further, FIG. 9 shows the ranges of the frequencies of the plasma excitation RF and the bias RF and respective powers thereof, in the aforementioned process. Still further, in case of the bias RF, the range of the bias potential is also shown.

Figure 7A:
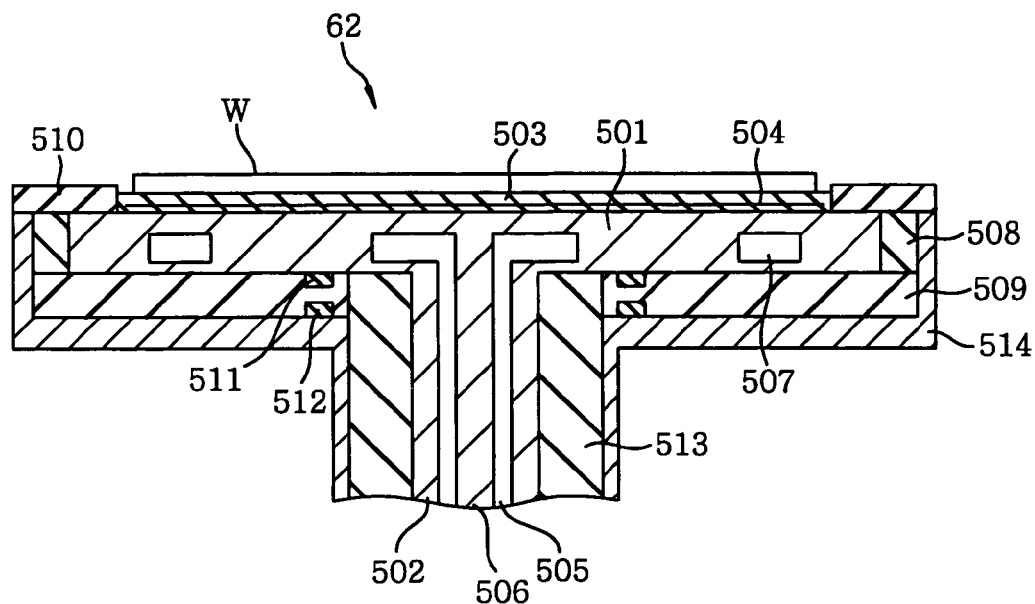
FIGS. 7A and 7B present partial cross sectional views showing a substrate supporting structure in accordance with a modified example of the first embodiment.
Figure 7B:
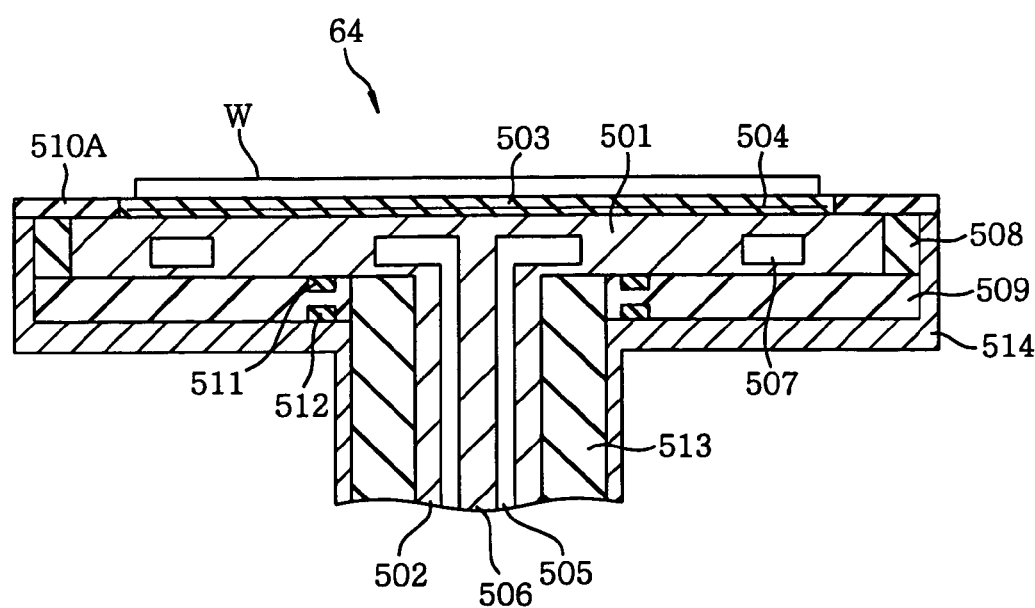

The substrate supporting structure 50 is not limited to those shown in FIGS. 2~6, and it may be variously modified and changed. FIGS. 7A and 7B are partial cross sectional views of the substrate supporting structure in accordance with a modified example of the first embodiment.

In a substrate supporting structure 62 shown in FIG. 7A, the dielectric layer 503 is formed only in a region that is not covered with the focus ring 510 on the top surface (to which the substrate W is contacted) of the electrode part 501. As mentioned above, the part, in which the dielectric layer is formed, becomes simplified, so that the number of processings of, e.g., ceramic spraying, is reduced, and thus, lowering the production cost. Namely, the dielectric layer can be easily formed by such a method that ceramic powders are supplied into the plasma of an atmospheric pressure or vacuum to perform a plasma spraying coating on an object. Further, as described above, it is possible to variously change an area or a shape of the electrode part 501 to be coated with the dielectric layer, if necessary.

In a substrate supporting structure 64 shown in FIG. 7B, a focus ring 510A is thinner than the focus ring 510 of the substrate supporting structure 50. The height of the top surface (to which plasma is exposed) of the focus ring 510A coincides with that of the dielectric layer 503. In this case, specifically, non-uniformity in the bias potential in the vicinity of edge of the substrate W is improved. As a result, an improvement in the uniformity in a sputter etching rate of in-surface of the substrate W can be realized.

Further, a material of the focus ring may be changed to change permittivity thereof. In this case, since the bias potential in the vicinity of the wafer edge is changed, the in-surface uniformity in a sputter etching rate may be improved.

Figure 8:
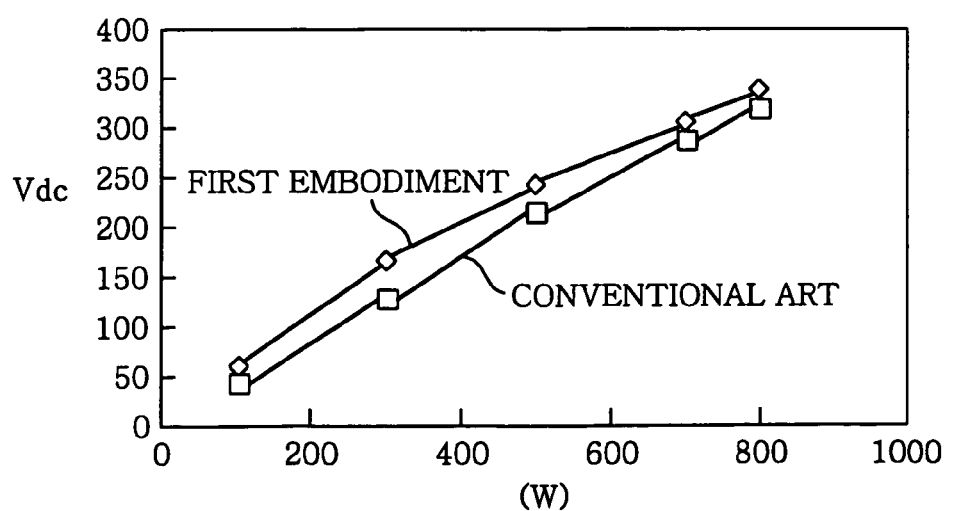
FIG. 8 is a graph showing a measurement result of self-bias potential in case of applying a high frequency power to a mounting table.

FIG. 8 is a graph showing measurement results of the self-bias potential, in case where a high frequency power is applied to the mounting table. Herein, in the plasma processing device 10 having the substrate supporting structure 50 mounted thereon in accordance with the first embodiment, an RF power was applied to the substrate supporting structure 50, and a self-bias voltage Vdc was measured at the substrate supporting table. Further, for comparison, the voltage Vdc for the conventional substrate supporting structure was measured. In the conventional substrate supporting structure, the RF transmission path was thin compared to the substrate supporting structure 50, and a coaxial structure as described above was not formed.

As for conditions of Vdc measurement, the flow rate of Ar gas was 2.9 sccm. The pressure in the processing chamber was 0.5 mTorr. The temperature of the mounting table was room temperature (about 20~30° C.) in case of using the substrate supporting structure 50; and it was 200° C. in the conventional case. The plasma density was set at $2.5 \times 10^{10}$ atoms/cm$^3$. For this, the RF power for plasma excitation was 1000 W in case of using the substrate supporting structure 50; and it was 800 W in the conventional case.

As illustrated in FIG. 8, Vdc of the substrate supporting structure 50 in accordance with the first embodiment was higher, compared to the conventional case. For example, if the RF power applied to the mounting table was 300 W, Vdc was 126 V in the conventional case, and 162 V in case of using the substrate supporting structure 50, corresponding to a potential of about 1.3 times.

The reason may be conjectured that, in the substrate supporting structure 50 in accordance with the first embodiment, the RF power is efficiently transferred by the coaxial structure using the transmission path 502 as a central conductor. Another reason may be considered that the introduction channel, the discharge channel, the DC wiring, the heat transfer gas path and the like are all disposed within the RF transmission path 502, to thereby, lower impedance of the RF. That is, in the latter case, while the entire substrate supporting structure becomes small, the surface area of the transmission path 502 increases, and thus, lowering impedance of the RF.

Second Embodiment

In the aforementioned plasma processing device 10, if the metal oxide formed on the surface of metal, e.g., copper, aluminum or the like, is etched, metal removed from the substrate W to be processed is scattered. Scattered metal is deposited onto the top surface of the insulating focus ring 510 around the substrate W to be processed, and thus, forming a metal film. If the metal film is grown, a discharge path may be formed between the substrate to be processed (semiconductor wafer) W and the conductive cover (pedestal conduction layer) 514, which is grounded, through the metal film. In this case, since charged particles on the metal film flow on the cover 514 as a current, there may be incurred a loss of the RF power supplied to the electrode part 501. For the same reason, the processing efficiency is lowered and the processing uniformity is deteriorated due to a decrease in the self-bias or abnormal discharge in the discharge path.

Further, an electromagnetic configuration on the surface of the mounting table 51 may be seriously changed due to the formation of a metal film. In this case, the change due to the aging of the plasma state on the mounting table 51 may occur, and reproducibility of processing will be deteriorated. Further, if a conductive metal film is formed in the focus ring 510, the situation becomes practically same as the case where a lower electrode has an area larger than the substrate W to be processed. In this case, the self-bias is lowered; the etching rate is lowered; and hence, the processing uniformity (inter-surface uniformity) between plural substrates to be processed is deteriorated.

A second embodiment relates to a plasma processing device for resolving the aforementioned problems. Thus, a device in accordance with the second embodiment has an effective configuration for a case when processing a substrate having a conductive film. As for such a processing, there may be enumerated a processing for removing an oxide film formed on a surface of, e.g., Cu, Si, Ti, TiN, TiSi, W, Ta, TaN, WSi, poly-Si or the like.

Figure 10:
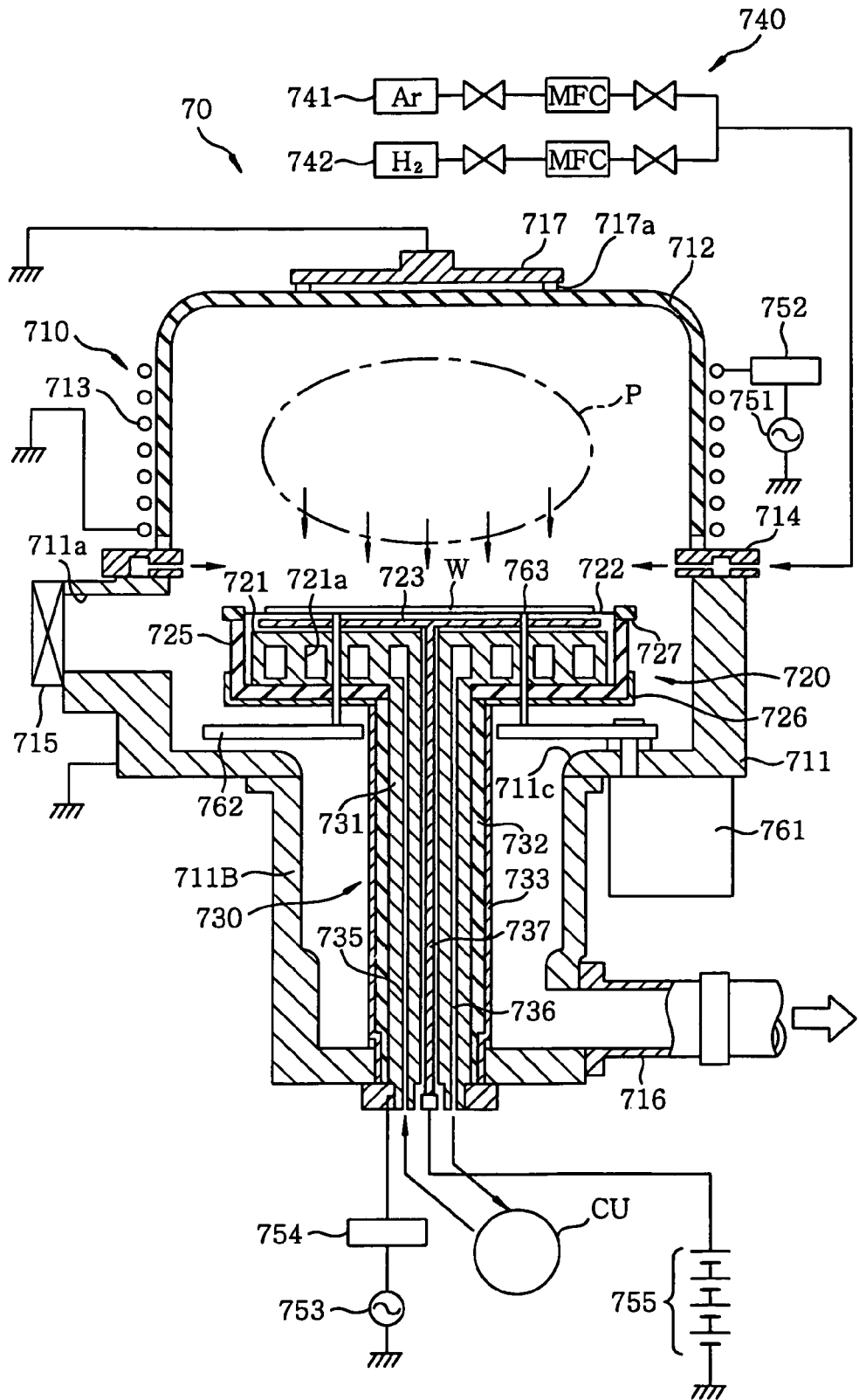
FIG. 10 describes a schematic configuration cross sectional view showing a schematic configuration of a plasma processing device.

FIG. 10 is a configuration diagram showing a plasma processing device including a substrate supporting structure for semiconductor processing in accordance with the second embodiment of the present invention.

As shown in FIG. 10, a plasma processing device 70 has a cylindrical processing chamber 710 in which a mounting table 720 is disposed. The processing chamber 710 is connected to a gas supply unit 740 for supplying a processing gas thereinto. To a gas exhaust port 711c formed in the center of bottom portion of the processing chamber 710, there is airtightly connected a substantially cylindrical exhaust chamber 711B, which is downwardly protruded. In the same manner as in the first embodiment, a support 730 for supporting the mounting table 720 is concentrically disposed in the exhaust chamber 711B.

An exhaust unit (not shown) having a vacuum pump and the like is coupled to a sidewall of the exhaust chamber 711B through a gas exhaust line 716. By the exhaust unit, an inside of the processing chamber 710 is exhausted, and at the same time, it is set to be kept at a predetermined vacuum pressure, e.g., in the range of 0.1 mTorr~1.0 Torr.

The processing chamber 710 is formed by combining a conductive cylindrical lower vessel 711 with an insulating cylindrical upper vessel or a bell jar 712. The lower vessel 711 is made of a metal (conductor), e.g., aluminum, alloy thereof or the like. The bell jar 712 is made of an insulator, e.g., glass, ceramic ($Al_2O_3$, AlN) or the like.

Around the bell jar 712, an induction coil 713 is wound. The induction coil 713 is connected to an RF power supply 751 through a matching unit 752. From the RF power supply 751, an RF power of, e.g., 450 kHz is supplied to the coil 713, so that an induced electromagnetic field is formed in the bell jar 712. Further, the lower vessel 711 and the coil 713 are grounded.

Between the lower vessel 711 and the bell jar 712, a gas supply ring 714 is airtightly formed with a sealing material such as O-ring or the like. The gas supply ring 714 is connected to a gas source 741 (e.g., Ar gas) and a gas source 742 (e.g., $H_2$ gas) of the gas supply unit 740, through valves and flow meters. The gas supply ring 714 has plural gas inlet openings disposed equi-spacedly around the processing chamber 710. The gas inlet openings uniformly discharge a processing gas (plasma generation gas) supplied from the gas supply unit 740 towards the center of the bell jar 712.

At a sidewall of the lower vessel 711, there is formed an opening 711a, in which a gate valve 715 is disposed. While the gate valve 715 is opened, the substrate W to be processed can be loaded into the processing chamber 710 and unloaded therefrom.

On a top portion of the bell jar 712, an upper electrode 717, which is grounded, is disposed to face in the direction toward the mounting table 720. The upper electrode 717 is made of a conductive material such as aluminum, which is alumite processed. The upper electrode 717 serves as an electrode facing toward a lower electrode disposed on the mounting table 720, and functions to prevent any failure of plasma ignition and to facilitate easy ignition. The upper electrode 717 fixes and assists the bell jar 712 through buffer members (plural pads, which are equi-spacedly disposed) 717a made of, e.g. a resin and the like.

An electrode part (lower electrode) 721 is disposed on the mounting table 720. The lower electrode 721 is coupled to an RF power supply 753 through an RF transmission path 731 in the support 730, a matching unit 754 and the like. From the RF power supply 753, an RF power of, e.g., 13.56 MHz is supplied to the lower electrode 721, and a bias potential is applied to the substrate W to be processed. Further, the lower electrode 721 and the transmission path 731 are molded as a unit in the same manner as in the first embodiment.

In the lower electrode 721, there is formed a heat exchange medium channel (temperature control space) 721a as a flow path for flowing a heat exchange medium, e.g., an insulating cooling fluid, for adjusting the temperature of the mounting table 720. Meanwhile, in the transmission path 731 of the support 730, there are formed introduction channel 735 and discharge channel 736 for supplying the heat exchange medium in the temperature control space 721a and discharging it therefrom.

The introduction channel 735 and the discharge channel 736 are coupled to a circulation unit CU, e.g., a chiller or the like, which functions to control temperature. The heat exchange medium is circulated from the circulation unit CU to the temperature control space 721a of the mounting table 720 through the introduction channel 735 and the discharge channel 736, so that the temperature of the mounting table 720 is maintained at a predetermined temperature. For example, the substrate W to be processed is controlled to be kept at a predetermined temperature in the range of −20~10° C. Instead of the temperature control space 721a, any temperature control means may be provided in the mounting table 720. For example, a resistance heater may be built in the mounting table 720.

The lower electrode 721 is covered with a dielectric layer (insulating layer) 722 such as alumina or the like, to be insulated from surroundings. The dielectric layer 722 forms a mounting surface of the mounting table 720 for mounting thereon the substrate W to be processed. An electrode 723 is inserted in the dielectric layer 722 of the mounting surface to form an electrostatic chuck therewith. The electrode 723 is connected to a DC power supply 755 disposed outside the processing chamber 720 through a wiring 737, which extends through the transmission path 731 while being insulated. By applying a voltage to the electrode 723, the substrate W to be processed is electrostatically adsorbed on the mounting table 720.

Side and bottom surfaces of the lower electrode 721 are covered with an insulating layer 725 made of an insulating material such as quartz and the like. A part of the lower and side surfaces of the insulating layer 725 is also covered with a cover 726 made of a conductive material such as Al and the like. The lower electrode 721, the insulating layer 725 and the conductive cover 726 are coaxially configured.

Meanwhile, the transmission path 731 of the support 730 is coated with an insulating layer 732. The insulating layer 732 is also made of a conductive material such as Al and the like; electrically connected to the conductive cover 726; and coated with a cover 733 that is grounded. The transmission path 731, the insulating layer 732 and the conductive cover 733 are coaxially configured.

Namely, the substrate supporting structure in accordance with the second embodiment also is coaxially configured such that the mushroom shaped conductive cores 721 and 731 connected to the RF power supply for the bias 753 are covered with the insulating layers (dielectric layers) 725 and 732, and also, covered with the conductive covers 726 and 733 that are grounded. Since the conductive covers 726 and 733 are grounded, charges flow to the ground even though an induced electromagnetic field is formed in the covers 726 and 733. For the same reason, a plasma is not produced in an exhaust space below the mounting table 720 when the RF power is applied to the lower electrode 721. By such a configuration, the loss of the RF power is reduced, and the bias can be applied efficiently and stably to the substrate to be processed.

At an upper outer periphery of the mounting table 720, there is disposed a conductive ring-shaped extension member 727 surrounding the substrate W to be processed. The extension member 727 has an exposed top surface in parallel with that of the substrate W to be processed (preferably, heights thereof are equal to each other) when the substrate W to be processed is mounted on the mounting table 720. The extension member 727 is insulated from the electrode 721 by the dielectric layer 722. Further, the extension member 727 is insulated from the conductive cover 726 by the insulating layer 725 or by having a sufficiently wide gap. In the second embodiment, the extension member 727 is insulated from all neighboring members, to which a potential is supplied. In other words, the extension member 727 is in a floating state where no potential is supplied.

It is preferable that the conductive extension member 727 is configured to totally surround the periphery of the substrate W to be processed. The extension member 727 is formed of various conductive materials such as metal, e.g., titanium, aluminum, stainless steel or the like, or low resistance silicon. Preferably, the extension member 727 is formed of titanium or alloy thereof that hardly produces particles and the like due to the peeling of conductor. Alternatively, the surface of the extension member 727 may be coated with titanium or alloy thereof.

Outside the processing chamber 720, a driving source 761 formed of an electric motor, a fluid pressure cylinder and the like is disposed. The driving source 761 raises and lowers a plurality of lift pins 763 through a driving member 762. By elevation of the lift pins 763, the substrate W to be processed is elevated from the mounting surface of the mounting table 720. By this, the lift pins 763 assists the substrate W to be transported to the mounting table 720.

FIG. 11 is a schematic configuration view showing a configuration of a main part of the plasma processing device shown in FIG. 10. The plasma processing device 70 includes a conductive sealing box 719 coupled to the lower vessel 711 to cover the upper side thereof. The bell jar 712 and the induction coil 713 are accommodated in the sealing box 719. The sealing box 719 is grounded, which functions to shut off any plasma emission (Ultra Violet or the like) or electromagnetic field. Further, the upper electrode 717 is supported by a member 718 in an upper part of the sealing box 719.

In the aforementioned plasma processing device 70, a processing gas (e.g., gaseous mixture of Ar gas and $H_2$ gas) from the gas supply unit 740 is introduced into the processing chamber 710 through the gas supply ring 714. At this time, the processing chamber 710 is exhausted through the exhaust chamber 711B and the gas exhaust line 716; and it is set to be maintained at a predetermined pressure (vacuum), e.g., in the range of 0.1 mTorr~1.0 Torr. In such a state, an RF power, e.g., in the range of 100~1000 W, is applied to the induction coil 713. By this, the processing gas turns into a plasma in the bell jar 712, and a plasma region (P) is formed above the substrate W to be processed (see FIG. 10).

If an RF power is supplied to the electrode 721 of the mounting table 720, a self-bias voltage is generated. By such a self-bias voltage, ions in the plasma are accelerated to collide with the surface of the substrate W to be processed, and etching is carried out.

In the plasma processing device 70, a metal or an metal oxide on the surface of the substrate W to be processed, e.g., an oxide film on the surface of Cu, Si, Ti, TiN, TiSi, W, Ta, TaN, WSi, poly-Si or the like, is etched. In this case, as mentioned above, the metal is scattered from the substrate W to surroundings, so that a metal film may be formed in the surroundings. However, in the second embodiment, the aforementioned metal film is formed mainly on the exposed surface of the extension member 727.

Figure 12:
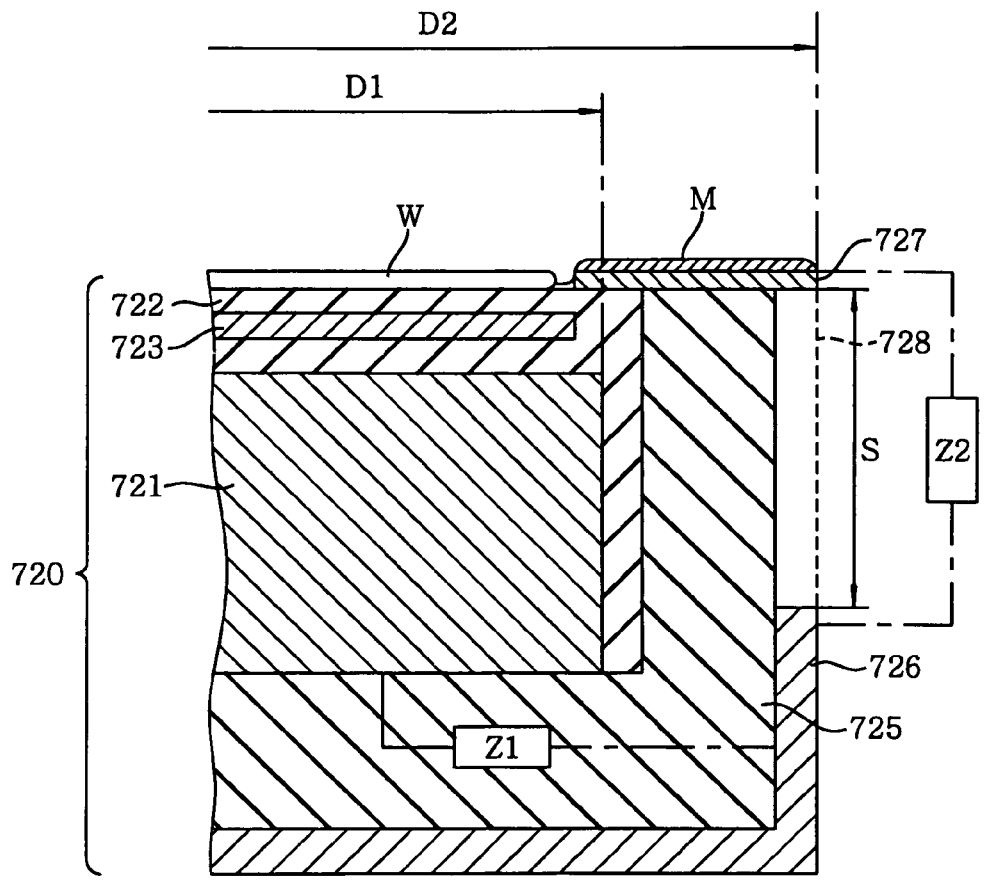
FIG. 12 presents a magnified partial cross sectional view schematically showing a configuration of an outer periphery of the mounting table.

FIG. 12 is a magnified partial cross sectional view showing that a metal film M is formed on the extension member 727, in the plasma processing device shown in FIG. 10. As illustrated in FIG. 12, a gap 728 for sufficiently insulating the discharge path is formed between the extension member 727 and the conductive cover 726. For the same reason, even though the metal film M is formed on the extension member 727, an electromagnetic environment at the outer periphery of the mounting table 720 is hardly changed. Namely, even though the metal film M is formed on the extension member 727, currents does not flow to the ground, and an electrode area is not changed. Moreover, there is no problem that the discharge path is formed at the outer periphery of the mounting table 720, or abnormal discharge occurs.

Further, since the conductive extension member 727 is sufficiently insulated from periphery members by the insulating layer 725, there will be no current flow generated by the RF power supplied to the electrode 721 through the extension member 727. Therefore, waste of processing power of the device resulting from a drift of the self-bias becomes reduced.

Namely, in the second embodiment, the conductive extension member 727 is disposed from the beginning, expecting the formation of the metal film M, so that electromagnetic situation around the substrate W is hardly changed although the metal film M is formed. Accordingly, the uniformity (inter-surface uniformity) in a processing performed on plurality of substrates can be improved, since the plasma is uniformly produced on the substrate.

One of the electromagnetic considerations is related with the insulation between the extension member 727 and the conductive cover 726. If the upper portion of the cover 726 of the mounting table is close to the extension member 727, a leakage in the power applied to the electrode 721 is increased and the processing cannot be performed efficiently and stably. In the configuration shown in FIG. 12, a sufficiently long distance S through the gap 728 between the cover 726 and the extension member 727 is secured.

Specifically, in the second embodiment, it can be configured that impedance Z2 (a distance S between the extension member 727 and the cover 726) between the extension member 727 and the cover 726 is greater than impedance Z1 (a thickness of the insulating layer 725) between the lower electrode 721 and the cover 726. These impedance values are obtained by using as a reference frequency the RF applied to the lower electrode 721. By such a configuration, it is possible to reduce (substantially suppress) the current due to the RF power applied to the electrode 721 that flows through the extension member 727. In other words, an impedance change between the electrode 721 and the cover 726 due to the extension member 727 is hardly generated, and the discharge path is hardly formed.

Further, as for a method for securing a sufficiently high insulation resistance (impedance) between the conductive cover 726 and the extension member 727, an insulator (dielectric material) is disposed in the gap 728 such that it can be used to obtain a desired resistance by making a change in permittivity or shape thereof by design. For example, a dielectric material is disposed in the gap 728 indicated by the dotted line in FIG. 12, so that substantial permittivity of the insulating material, disposed between the cover 726 and the extension member 727, is changed. That is, impedance therebetween can be changed by disposing the insulator in the gap 728, so that Z2 may be designed to be greater than Z1. By doing this, the discharge path is not formed while the processing may be performed stably.

Further, in the second embodiment, an exposed surface of the conductive extension member 727 is configured in parallel with the surface of the substrate W to be processed (preferably, heights thereof are equal to each other), so that the surface area of the electrode 721 of the mounting table 720 is substantially increased. Namely, same electromagnetic environment is provided in case where a surface area of the electrode 721 becomes π·(D2)2 due to the extension member 727, compared to the case where the surface area of the electrode 721 is π·(D1)2. Herein, D1 is a radius of the electrode 721 (a radius of simulated circle having the same area as an object); and D2 is a radius corresponding to an outer peripheral shape of the extension member 727.

Figures 13A, 13B:
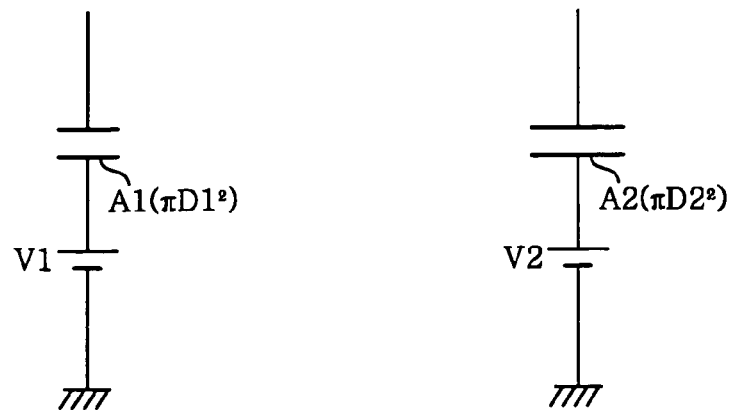
FIGS. 13A and 13B are circuit diagrams showing equivalent circuits for a plasma in the plasma processing device and a lower electrode.

FIGS. 13A and 13B show simplified equivalent circuits of the mounting table 720, for the cases when the electrode area of the mounting table 720 is assumed to be A1 and A2 and respective self-bias voltages are assumed to be V1 and V2. Herein, the electrode areas A1 and A2 are π·(D1)2 and π·(D2)2, respectively, wherein A1<A2. In this case, following relationship is formed between the electrode area and the self-bias voltage.

$$(V2/V1) = (A1/A2)^4 \qquad \text{(Relational equation 1)}$$

Namely, as described above, in case when A1<A2, and hence, V>V2, as the electrode area is increased, the self-bias voltage is rapidly decreased. Therefore, if the extension member 727 is not disposed, the processing will proceed and the metal film M will be deposited, so that an effective electrode area of the mounting table will get increased. Accordingly, the self-bias voltage is gradually decreased, and the processing state will be changed. Contrary to this, in the second embodiment, there exists the extension member 727 from the beginning of the substrate processing, as shown in FIG. 13B. Moreover, although the processing proceeds and the metal film M is adhered, the effective electrode area is hardly changed. Therefore, the self-bias voltage is hardly changed, and the processing can be performed stably. Further, the extension member 727 is configured to be attached to the mounting table 720 and detached therefrom freely, the extension member 727 can be readily replaced. In this case, maintenance of the device may be simply carried out.

Figure 14:
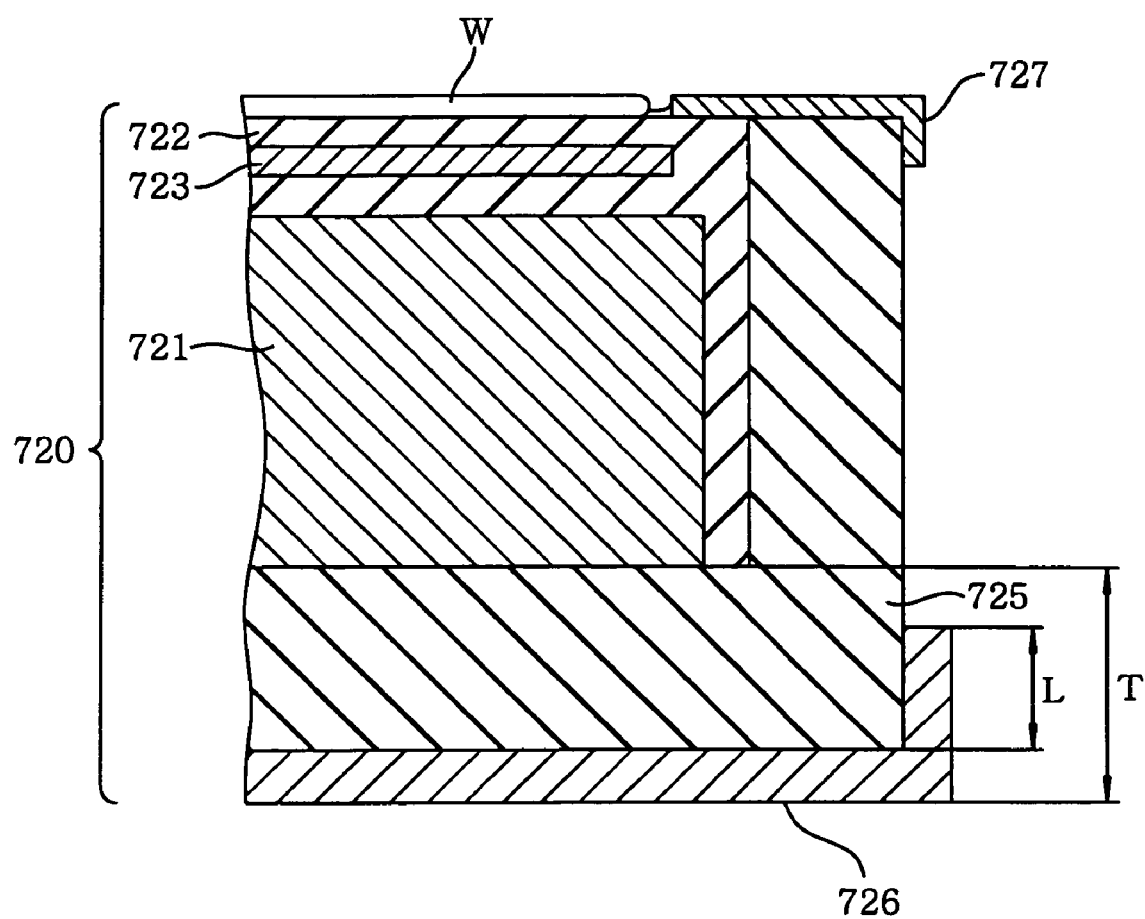
FIG. 14 shows a magnified partial cross sectional view of the plasma processing device in accordance with a modified example of the second embodiment.

FIG. 14 is a magnified partial cross sectional view of the plasma processing device in accordance with the modified example of the second embodiment. This modified example has a configuration such that, compared to the configuration shown in FIG. 12, the power leakage of the lower electrode 721 is reduced, and at the same time, it is unlikely to make the conductive cover 726 and the extension member 727 have a short circuit due to the metal film of by-product.

Specifically, as illustrated in FIG. 14, in the relationship between a thickness of the insulating layer 725 and a position of top end of the conductive cover 726, it is configured to satisfy the relationship of L<T. Here, L means a level difference between the bottom portion of the insulating layer 725 in the side thereof and the top end of the cover 726. Further, T means the thickness of the insulating layer 725 between the lower electrode 721 and the cover 726. In other words, in the side of the insulating layer 725, the top end of the conductive cover 726 is configured to be placed below the bottom portion of the lower electrode 721.

By this, it is possible to control impedances of Z1 and Z2, thereby, improving uniformity of plasma.

While the invention has been shown and described with respect to the preferred embodiments, it will be understood by those skilled in the art that various changes and modifications may be made without departing from the spirit and scope of the invention as defined in the following claims. For example, in the first and second embodiments, the plasma etching device has been explained, but the present invention may be applicable to a plasma film forming device, a plasma ashing device or the like, in the same manner. The substrate to be processed is not limited to a semiconductor wafer, and a glass substrate, an LCD substrate or the like may be employed.

In accordance with the present invention, it is possible to provide a substrate supporting structure and a plasma processing device for semiconductor processing capable of realizing a scaling-down to reduce the overall size and reducing cost.

Further, in accordance with the present invention, it is possible to provide a plasma processing device capable of increasing at least inter-surface uniformity in a film formed on the substrate to be processed.

What is claimed is:

1. A substrate supporting structure for semiconductor processing comprising:
    a mounting table for mounting thereon a substrate to be processed;

a support part, disposed to be downwardly extended below the mounting table, for supporting the mounting table;

an electrostatic chuck, disposed on the mounting table, for electrostatically adsorbing the substrate to the mounting table; and a wiring for supplying a DC voltage to the electrostatic chuck, wherein the mounting table includes an electrode part; a first insulating layer for covering a periphery of the electrode part; a second insulating layer for covering a bottom surface of the electrode part; and a first conducting layer covering the entire first and second insulating layers, wherein the support part includes a conductive transmission path for supplying a power to the electrode part; a third insulating layer for covering a periphery of the transmission path; and a second conducting layer for covering a periphery of the third insulating layer, wherein the electrode part of the mounting table, the first and the second insulating layers and the first conducting layer are coaxially configured; the conductive transmission path of the support part, the third insulating layer and the second conducting layer are coaxially configured; the electrode part and the conductive transmission path are integrally formed; and the first and the second conducting layers are electrically connected to each other, wherein a first channel for supplying a heat exchange medium into the electrode part is formed; and a second channel communicated with the first channel is formed in the conductive transmission path, wherein, in the mounting table and the support part, a first sealing member is disposed between the electrode part and the second insulating layer and a second sealing member is disposed between the second insulating layer and the first conducting layer in order to airtightly separate a mounting table side and a support part side, wherein each of the first and the second insulating layer is made of quartz, and the third insulating layer is made of a resin, wherein the second channel is formed in a thermally insulating tube installed in the conductive transmission path, wherein the conductive transmission path comprises said wiring to supply the DC voltage to the electrostatic chuck, wherein the wiring has an enlarged diameter head portion of a substantially multi stepped cone shape at a part in contact with the electrostatic chuck, the head portion having a bottom portion of a relatively larger diameter and a top portion which reduces in diameter towards an electrode layer of the electrostatic chuck, and being coated with a thermal spraying insulating film, and wherein the conductive transmission path is provided with an insertion hole to introduce the wiring therethrough, and the insertion hole is filled with insulation layers to insulate the introduced wiring, Where the head portion and the wiring are secured by conforming the insulation layers around the wiring part in the insertion hole.

2. The substrate supporting structure of claim 1, further comprising a gas flow passage, formed in the transmission path, for supplying a heat transfer gas between the mounting table and the substrate.

3. The substrate supporting structure of claim 1, wherein each of the first and the second insulating layer is made of a low dielectric quartz.

4. The substrate supporting structure of claim 1, wherein the third insulating layer is made of a low dielectric resin.

5. The substrate supporting structure of claim 1, wherein the power supplied to the electrode part is a high frequency power.

6. The substrate supporting structure of claim 1, wherein the electrostatic chuck is configured such that an electrode layer is embedded between an upper and a lower insulating layer; and the electrode layer and the insulating layers of the electrostatic chuck are integrally formed to have an uneven surface structure such that a groove is formed on a surface of the electrostatic chuck; and a gas flow passage, formed in the transmission path for supplying a heat transfer gas between the mounting table and the substrate, is connected to the groove.

7. The substrate supporting structure of claim 1, wherein the head portion is of an overlapped shape of plural subportions having different diameters.

8. The substrate supporting structure of claim 1, wherein the insertion hole is provided with a ring, and the wiring is attached to a hole formed in the ring.

9. A plasma processing device, comprising:

an airtight processing chamber for accommodating therein a substrate to be processed;

a gas supply unit for supplying a processing gas into the processing chamber;

a gas pumping unit for exhausting the processing chamber;

a mounting table, disposed in the processing chamber, for mounting thereon the substrate;

a support part, disposed to be downwardly extended below the mounting table, for supporting the mounting table;

an electrostatic chuck, disposed on the mounting table, for electrostatically adsorbing the substrate to the mounting table; and a wiring for supplying a DC voltage to the electrostatic chuck, wherein the mounting table includes an electrode part; a first insulating layer for covering a periphery of the electrode part; a second insulating layer for covering a bottom surface of the electrode part; and a first conducting layer covering the entire first and second insulating layers, wherein the support part includes a conductive transmission path for supplying a power to the electrode part; a third insulating layer for covering a periphery of the transmission path; and a second conducting layer for covering a periphery of the third insulating layer, wherein the electrode part of the mounting table, the first and the second insulating layers and the first conducting layer are coaxially configured; the conductive transmission path of the support part, the third insulating layer and the second conducting layer are coaxially configured; the electrode part and the conductive transmission path are integrally formed; and the first and the second conducting layers are electrically connected to each other, wherein a first channel for supplying a heat exchange medium into the electrode part is formed, and a second channel communicated with the first channel is formed in the conductive transmission path, wherein, in the mounting table and the support part, a first sealing member is disposed between the electrode part and the second insulating layer and a second sealing member is disposed between the second insulating layer and the first conducting layer in order to airtightly separate a mounting table side and a support part side, and wherein each of the first and the second insulating layer is made of quartz, and the third insulating layer is made of a resin, wherein the second channel is formed in a thermally insulating tube installed in the conductive transmission path, wherein the conductive transmission path comprises said wiring to supply the DC voltage to the electrostatic chuck, wherein the wiring has an enlarged diameter head portion of a substantially multi stepped cone shape at a part in contact with the electrostatic chuck, the head portion having a bottom portion of a relatively larger diameter and a top portion which reduces in diameter towards an electrode layer of the electrostatic chuck, and being coated with a thermal spraying insulating film, and wherein the conductive transmission path is provided with an insertion hole to introduce the wiring therethrough, and the insertion hole is filled with insulation layers to insulate the introduced wiring, where the head portion and the wiring are secured by conforming the insulation layers around the wiring part in the insertion hole.

10. The plasma processing device of claim 9, wherein an exhaust chamber having smaller outline than the processing chamber is connected to the support part to surround same below the processing chamber, and wherein the exhaust chamber exhausts the processing chamber through a space between the exhaust chamber and the support part.

11. The plasma processing device of claim 9, wherein the second conducting layer is grounded.

12. The plasma processing device of claim 9, wherein the second channel is connected to a circulation unit for circulating the heat exchanged medium.

13. The plasma processing device of claim 9, further comprising a gas flow passage, formed in the transmission path, for supplying a heat transfer gas between the mounting table and the substrate.

14. The plasma processing device of claim 9, wherein the power supplied to the electrode part is a high frequency power.

15. The plasma processing device of claim 9, wherein the insertion hole is provided with a ring, and the wiring is attached to a hole formed in the ring.

* * * * *